United States Patent
Blaedel et al.

(10) Patent No.: US 6,835,415 B2
(45) Date of Patent: Dec. 28, 2004

(54) COMPLIANT LAYER CHUCKING SURFACE

(75) Inventors: Kenneth L. Blaedel, Dublin, CA (US); Paul A. Spence, Pleasanton, CA (US); Samuel L. Thompson, Pleasanton, CA (US)

(73) Assignee: EUV LLC, Santa Clara, CA (US)

( * ) Notice: Subject to any disclaimer, the term of this patent is extended or adjusted under 35 U.S.C. 154(b) by 0 days.

(21) Appl. No.: 10/338,266

(22) Filed: Jan. 7, 2003

(65) Prior Publication Data

US 2004/0131775 A1 Jul. 8, 2004

(51) Int. Cl.$^7$ ................................................ C23C 16/00
(52) U.S. Cl. ............................... 427/248.1; 427/255.6; 427/250
(58) Field of Search ............................ 427/250, 255.6, 427/248.1; 118/728

(56) References Cited

U.S. PATENT DOCUMENTS 5,656,093 A * 8/1997 Burkhart et al. ............ 118/728
6,217,655 B1 * 4/2001 Kumar et al. ............... 118/500

* cited by examiner

Primary Examiner—Timothy Meeks
(74) Attorney, Agent, or Firm—John P. Wooldridge

(57) ABSTRACT

A method and apparatus are described wherein a thin layer of complaint material is deposited on the surface of a chuck to mitigate the deformation that an entrapped particle might cause in the part, such as a mask or a wafer, that is clamped to the chuck. The harder particle will embed into the softer layer as the clamping pressure is applied. The material composing the thin layer could be a metal or a polymer for vacuum or electrostatic chucks. It may be deposited in various patterns to affect an interrupted surface, such as that of a "pin" chuck, thereby reducing the probability of entrapping a particle.

14 Claims, 1 Drawing Sheet

COMPLIANT LAYER CHUCKING SURFACE

The United States Government has rights in this invention pursuant to Contract No. W-7405-ENG48 between the United States Department of Energy and the University of California for the operation of Lawrence Livermore National Laboratory.

BACKGROUND OF THE INVENTION

1. Field of the Invention

The present invention relates to minimizing defects in the components produced by an extreme ultraviolet lithography (EUVL) system, and more specifically, it relates to prevention of wafer and photomask deformation.

2. Description of Related Art

Wafers and photomasks are mounted (clamped) in various tools during their manufacture and their use. A particular type of mount is fabricated by physical vapor deposition (PVD) or chemical vapor deposition (CVD) from ceramic and used electrostatically with what is called the Johnsen-Rahbek effect as disclosed in U.S. Pat. No. 5,117,121. Other fabrication methods include plasma spray deposition, brazing, flame spray deposition and the like. The fabrication and use of these supports are known to generate particulates in various manners on the surfaces of these supports. The supports are also known as chucks.

In use, a wafer rests flush against the surface of the chuck body as a clamping force is generated by vacuum, or a chucking voltage is applied to electrodes on the chuck.

If the mounting surfaces of the tools allow any particulate to become entrapped between the mounting surface and the wafer or mask, then the wafer or mask may be deformed by the entrapped particle. For example, if the backside of a wafer is to be clamped, by vacuum or electrostatically against a flat reference surface, the entrapped particle could cause a deformation of the front side of the wafer, which will therefore not lie in a flat plane. There are many approaches to reducing the probability of trapping particulates including the use of a "pin" chuck that has a real area of contact that is about 1% of the nominal area of contact.

U.S. Pat. No. 5,656,093 is directed to a metal interrupted coating on the chuck surface that is less abrasive and compliant than the chuck surface itself. The purpose of the coating is to reduce the generation of debris on the backside of a wafer from tens of thousands of particles to hundreds of particles. The invention creates a distance between the underside surface of the wafer and the chuck as defined by the thickness of the support members, and requires that the distance be larger than the expected diameter of the contaminate particles so that the particles do not adhere to the underside of the wafer during processing. The patent indicates that the interrupted pattern allows a volume where debris can collect. The number and spacing of the pads must be judiciously (evenly) positioned to optimize support yet limit their interference with the clamping force. Cooling is provided by an ancillary heat transfer medium.

U.S. Pat. No. 6,019,166 teaches a pickup chuck having a heat slug for removing heat from a heat-generating device that is held within the pickup chuck. The patent indicates that the compliant layer cushions the backside, thereby reducing the likelihood of damaging the integrated circuit.

U.S. Pat. No. 6,117,246 discloses a nonabrasive conductive polymer pad for supporting a workpiece upon a workpiece support surface of an electrostatic chuck. The disclosure defines the conductive polymer pad as a polyimide or a fluoropolymer, and the like, with a controlled resistivity of about $10^7$ to $10^{12}$ ohm-cm and arranged in a plurality of islands and connector strips, optionally interconnected. The invention seeks to avoid particle generation due to abrasive contact. As with U.S. Pat. No. 5,656,093, the thickness of the stand-off pad should preferably be larger than the expected diameter of contaminant particles to avoid contaminant particles from adhering to the backside of the wafer during processing.

Studies have shown that a 10-micron particle on a flat chuck can displace a reticle (i.e., a test wafer) surface for a radial distance by an inch or more. The actual height and diameter of the particle-induced displacement is dependent on numerous parameters such as the particle size, the particle hardness, the clamping force and the reticle thickness. The radial distance that a particle will displace the reticle surface can be reduced by either making the reticle very thin or making the reticle very thick. In both cases, a high clamping force is desirable. If the reticle is thin, the reticle will bend to conform to the particle and the surface displacement will drop off quickly. If the reticle is thick, the reticle will not bend but rather plastically deform at the point of contact and the particle will be embedded in the reticle.

The likelihood of particle reduction on the substrate is influenced by the size of the particle being removed (smaller particles are less likely to be prevented while larger ones can be washed or filtered out). It would be more desirable to reduce the effect of the particle on surface deformation once it becomes entrapped, thereby allowing smaller spacing between the chuck and workpiece.

SUMMARY OF THE INVENTION

It is an object of the present invention to provide a complaint layer for supporting a wafer, or other workpiece, in a spaced-apart relation to a chuck that adsorbs contaminant particles that could create deformation in the workpiece.

It is another object to provide a method for using a chuck having a compliant layer.

These and other objects will be apparent to those skilled in the art based on the disclosure herein.

Compliant materials (e.g., polymers) allow particles to embed themselves into the material but also act rigidly to allow a wafer to conform to the lapped surface. The spacing between the conformal layer and the workpiece can then be on the same order as the expected particulates and thereby avoid the necessity for higher spacing of other chucks.

For manufacturing ease, the compliant layer may be built as an interrupted surface, e.g., a plurality of islands or a full—contact surface.

The compliant polymer material is different from the chuck material and must be conformal to ensure the compliant layer does not alter the overall form of the surface.

DETAILED DESCRIPTION OF THE INVENTION

Figure 1:
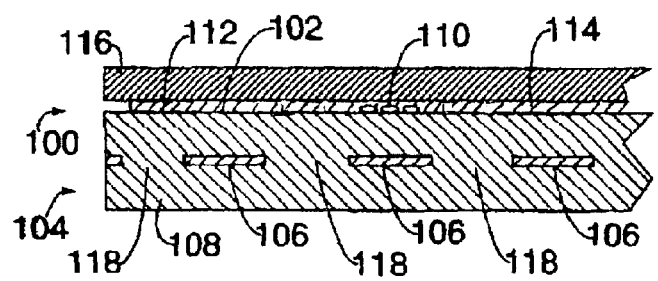
FIG. 1 shows a compliant layer chucking surface having a full—contact surface.

An electrostatic (or vacuum) chuck (fabricated by ordinary means) is provided. A compliant layer spacing mask, fabricated from, e.g., a compliant polymer material such as paralene or Teflon™ (polytetrafluoroethylene (PTFE)) and that is different from the material of the chuck surface, is deposited on the chuck surface. The chuck is used in the ordinary manner to mount the workpiece.

The material of the compliant layer must be quite compliant at small size, such as over the diameter of a small particle and must be quite stiff at large size, such as over the diameter of a wafer or length of a mask. Thus, the layer will allow a small particle to embed into the layer while it also acts rigidly to allow the wafer to conform to the form of the lapped surface. The compliance at small size stems from the layer's material properties, such as modulus of rigidity and yield stress. The compliant layer may be designed to have a modulus of rigidity that is less than that of a particle in the interface between the compliant layer and the wafer. The stiffness at large size stems from the thinness of the layer, i.e., the modulus of rigidity acts over a very small length in the thickness direction.

The chuck can utilize a full-contact surface, if it is desirable from a manufacturing perspective, even though an interrupted surface is functionally usable as well. For example, flat surfaces are more easily lapped to higher quality (i.e., better flatness) onto an object if the surface is continuous and not textured, like that of a pin chuck. If the complaint layer is deposited as a plurality of islands, then the interrupted surface is built up during the deposition of the compliant and after the lapping is done.

The deposition of the compliant layer must be conformal. There are many processes that fulfill this requirement This ensures that the compliant layer does not alter the overall form of the surface, which is usually flat. For example, a process that is uniform to 1% would suffer variation in thickness of 10 nm for a 1 micrometer-thick layer. This would therefore introduce an error to the form of an ideally flat chuck surface by about 10 nm.

The thickness of the deposition can be on the order of the thickness of the anticipated particulate. Thus, there is no need for such high pins that are characteristic of many pin chucks. One advantageous consequence for an electrostatic chuck is the lack of an increased spacing between the chuck surface and the workpiece due to unnecessarily high pins.

The layer can be much more compliant than the anticipated particulate or either surface. Thus a polymer such as paralene or Teflon would be desirable. It can be chosen to not be a particle generator when brought into contact with the wafer or mask. If heat needs to be removed from the mask or wafer by conduction, the layer can be thermally conductive. The layer can be easily stripped and reapplied to allow for refurbishment without the need to re-lap the flat surface. The material of the wafer spacing mask has superior adsorption properties as compared to other chuck surface materials.

FIG. 1 shows a compliant layer chucking surface having a full contact surface. The figure depicts a vertical cross-sectional view of a compliant layer 100 positioned atop the support surface 102 of a ceramic electrostatic chuck 104. To illustrate the use of the invention, FIG. 1 depicts the spacing mask 100 supporting a semiconductor wafer 116.

Although the preferred embodiment of the present invention is discussed as used in conjunction with a ceramic electrostatic chuck, the invention is also useful in supporting substrates above any form of chuck including non-ceramic electrostatic chucks, mechanical clamping chucks, and the like.

In one embodiment, the electrostatic chuck 104 contains one or more electrodes 106 imbedded within a ceramic chuck body 108. The ceramic chuck body is, for example, fabricated of aluminum-nitride or boron-nitride. Such a partially conductive ceramic material promotes the Johnsen-Rahbek effect during high temperature processing. Other partially conductive ceramics also form useful high temperature chuck materials such as alumina doped with a titanium oxide or a chromium oxide. If the chuck is to be used at low temperatures only, then other ceramic and/or dielectric materials such as alumina are used to form the chuck body. An illustrative ceramic electrostatic chuck is disclosed in U.S. Pat. No. 5,511,799 issued Apr. 30, 1996, herein incorporated by reference. Examples of non-ceramic electrostatic chucks are disclosed in U.S. Pat. No. 4,184,188, issued Jan. 15, 1980 and U.S. Pat. No. 4,384,918, issued May 24, 1983, both incorporated herein by reference.

The compliant layer 100 is deposited upon the support surface 102 of the chuck body 108 typically using a physical vapor deposition (PVD) process. The material may also be deposited by chemical vapor deposition (CVD), plasma spray deposition brazing, flame spray deposition, and the like. The material of the wafer spacing mask has superior contact properties as compared to the surface material of the chuck. For example, the mask material is less abrasive and more compliant (e.g., produces less particles) than the surface material of the chuck. Typically, the material used to form the mask is a compliant polymer material such as paralene or Teflon™. Other materials include metals such as titanium, titanium nitride, stainless steel and the like. Other materials, including conductors, insulators and semiconductors, that are compliant at small size, such as over the diameter of a small particle and that are quite stiff at large size, such as over the diameter of a wafer or length of a mask can also used to fabricate the spacing mask.

The spacing mask material is deposited to a pre-defined thickness that maintains the wafer 116, or other workpiece, above the support surface such that particles 110 on the support surface do not contact the wafer surface. An illustrative thickness is approximately 2 microns. Importantly, the contaminants tend to embed within the compliant layer 100.

Figure 2:
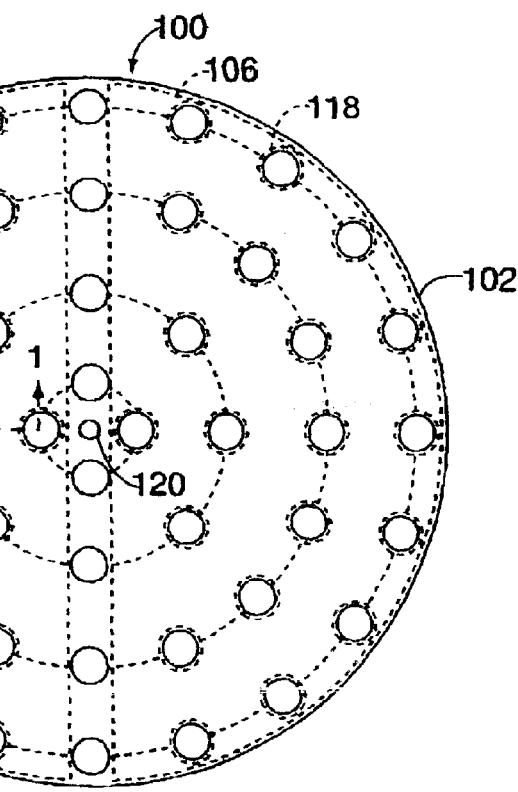
FIG. 2 shows a compliant layer chucking surface having a plurality of islands.

FIG. 2 shows a compliant layer chucking surface having a plurality of islands 112–112 of deposited compliant material. The concentric rings (shown as dashed lines) are spaced apart and the pads within each ring are spaced from one another. Generally speaking, the number, spacing and size of the pads is determined by the amount of clamping force applied by the electrostatic chuck. For example, if the amount of force is large and the pads are spaced relatively distant from one another, the wafer may bow between the pads. On the other hand, placing too many pads on the surface of the chuck could interfere with the electrostatic fields that facilitate the clamping force. Therefore, the pads must be judiciously positioned to optimize support yet limit their interference with the clamping force.

Other mask patterns may be used. The key feature of the invention is that the wafer is supported in a spaced-apart relation to the surface of the chuck by a spacing mask comprising compliant material as discussed above. The particular mask pattern and mask material is defined by the particular application for the chuck including such factors as chucking voltage, chucking force, wafer thickness, the chuck electrode pattern, the particular process that the wafer is to be subjected and the like.

The foregoing description of the invention has been presented for purposes of illustration and description and is not intended to be exhaustive or to limit the invention to the precise form disclosed. Many modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be defined by the following claims.

We claim:

1. A method of fabricating a wafer spacing mask comprising the steps of:

providing a workpiece support chuck having a support surface; and depositing a layer of paralene over said support surface, wherein said material comprises a modulus of rigidity that is less than that of a particle in an interface between said layer and a workpiece.

2. The method of claim 1, wherein the step of depositing comprises the step of using a physical vapor deposition process to deposit said material.

3. The method of claim 1, wherein said support surface is fabricated of a ceramic material.

4. The method of claim 3, wherein said ceramic material is partially conductive at temperatures above approximately 300 degrees Celsius.

5. The method of claim 3, wherein said ceramic material is aluminum-nitride, boron-nitride, or alumina doped with a conductive oxide.

6. The method of claim 1, wherein said support surface comprises dielectric material.

7. The method of claim 1, wherein said support surface comprises pre-defined pattern of pads.

8. The method of claim 1, wherein said workpiece support chuck is an electrostatic chuck.

9. A method of reducing the effect of particles entrapped between a workpiece and a chuck, comprising:

providing a workpiece support chuck having a support surface and a compliant material comprising paralene on said support surface, wherein said material comprises a modulus of rigidity that is less than that of a particle in an interface between said compliant layer and said workpiece; and adhering said workpiece to said material, wherein particulate located in an interface between said material and said workpiece will embed within said material.

10. The method of claim 9, wherein said support surface is fabricated of a ceramic material.

11. The method of claim 10, wherein said ceramic material is partially conductive at temperatures above approximately 300 degrees Celsius.

12. The method of claim 10, wherein said ceramic material is aluminum-nitride, boron-nitride, or alumina doped with a conductive oxide.

13. The method of claim 9, wherein said support surface is fabricated of a dielectric material.

14. The method of claim 9, wherein said workpiece support chuck is an electrostatic chuck.

* * * * *